United States Patent
Zha

(10) Patent No.: US 11,740,746 B2
(45) Date of Patent: Aug. 29, 2023

(54) SENSOR DEVICE AND DISPLAY DEVICE

(71) Applicant: Shenzhen China Star Optoelectronics Semiconductor Display Technology Co., Ltd., Guangdong (CN)

(72) Inventor: Bao Zha, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 277 days.

(21) Appl. No.: 17/262,086

(22) PCT Filed: Dec. 30, 2020

(86) PCT No.: PCT/CN2020/141334
§ 371 (c)(1),
(2) Date: Jan. 21, 2021

(87) PCT Pub. No.: WO2022/141177
PCT Pub. Date: Jul. 7, 2022

(65) Prior Publication Data
US 2022/0397981 A1 Dec. 15, 2022

(30) Foreign Application Priority Data
Dec. 29, 2020 (CN) .......................... 202011588547.X

(51) Int. Cl.
*G06F 3/044* (2006.01)
*G06F 3/01* (2006.01)
(Continued)

(52) U.S. Cl.
CPC ............ *G06F 3/0445* (2019.05); *G06F 3/016* (2013.01); *G06F 3/0304* (2013.01);
(Continued)

(58) Field of Classification Search
CPC ...... G06F 3/0445; G06F 3/016; G06F 3/0304; G06F 3/0443; G06F 2203/04111;
(Continued)

(56) References Cited

U.S. PATENT DOCUMENTS

| 2014/0375580 A1* | 12/2014 | Peshkin | G06F 3/016 345/173 |
| 2015/0153877 A1* | 6/2015 | Han | G06F 3/0445 345/174 |

(Continued)

FOREIGN PATENT DOCUMENTS

| CN | 105892762 A | 8/2016 |
| CN | 107168591 A | 9/2017 |

(Continued)

OTHER PUBLICATIONS

Machine translation of ON 111696494 (Year: 2020).*
Machine translation of WO 2018/056511A1 (Year: 2018).*

*Primary Examiner* — Patrick N Edouard
*Assistant Examiner* — Joseph P Fox

(57) ABSTRACT

The present application discloses a sensor device and a display device. The sensor device includes a substrate, a light control component, a touch control component, and a functional dielectric layer, wherein the light control component and the touch component are disposed on the substrate, the touch component is disposed on the light control component, and the functional dielectric layer is disposed on a side of the touch control component away from the substrate and at least covers the touch control component, and configured to apply an electrostatic force to an external object when the external object is in contact with the functional dielectric layer.

12 Claims, 5 Drawing Sheets

(51) Int. Cl.
*G06F 3/03* (2006.01)
*H01L 27/144* (2006.01)
*H01L 31/0216* (2014.01)
*H01L 31/113* (2006.01)

(52) U.S. Cl.
CPC ........ *G06F 3/0443* (2019.05); *H01L 27/1446* (2013.01); *H01L 31/02164* (2013.01); *H01L 31/1136* (2013.01); *G06F 2203/04111* (2013.01)

(58) Field of Classification Search
CPC ............... G06F 3/0412; H01L 27/1446; H01L 31/02164; H01L 31/1136
See application file for complete search history.

(56)  References Cited

U.S. PATENT DOCUMENTS

| | | | |
|---|---|---|---|
| 2016/0239143 A1* | 8/2016 | Song | .................... G06F 3/0446 |
| 2017/0168614 A1 | 6/2017 | Wei | |
| 2018/0374911 A1* | 12/2018 | Wu | .................... H01L 27/3234 |
| 2020/0218351 A1 | 7/2020 | Orita | |

FOREIGN PATENT DOCUMENTS

| | | | | |
|---|---|---|---|---|
| CN | 109346503 A | 2/2019 | | |
| CN | 110286796 A | 9/2019 | | |
| CN | 111696494 A | 9/2020 | | |
| CN | 112051922 A | 12/2020 | | |
| CN | 112114700 A | 12/2020 | | |
| EP | 3276468 A1 * | 1/2018 | ......... | G06F 3/03547 |
| WO | WO-2018056511 A * | 3/2018 | ............. | G06F 3/041 |

\* cited by examiner

SENSOR DEVICE AND DISPLAY DEVICE

BACKGROUND OF INVENTION

Field of Invention

The present application relates to the field of display technology, in particular to a sensor device and a display device.

Description of Prior Art

With the development of display technology and its wide application in various fields, it has become a trend to integrate various sensors into the display panel.

At present, the display device with a touch control screen mainly integrates the touch control component in the display panel or is disposed on the display panel to form a touchable display device. However, with the increase in user demand for display devices and the development of human-computer interaction, a new sensor device needs to be integrated in the display panel to make up for the shortcomings of a single-function touch control display device.

Therefore, there is a need to propose a new technical solution to solve the above technical problems.

SUMMARY OF INVENTION

Embodiments of the present application provide a sensor device and a display device, which are used to realize the functions of short-range touch control and remote light control to make up for the shortcomings of single-function touch control or light control.

An embodiment of the present application provides a sensor device, including:

a substrate;

a light control component disposed on the substrate;

a touch control component disposed on the substrate and located on one side of the light control component; and a functional dielectric layer disposed on a side of the touch control component away from the substrate and at least covers the touch control component, and configured to apply an electrostatic force to an external object when the external object is in contact with the functional dielectric layer, wherein the electrostatic force is positively correlated with a voltage value of the touch control component, a contact area of the external object with the functional dielectric layer, and a dielectric constant of the functional dielectric layer.

In the sensor device provided by an embodiment of the present application, the dielectric constant of the functional dielectric layer is greater than or equal to 2.5.

In the sensor device provided by an embodiment of the present application, a thickness of the functional dielectric layer ranges between 1 micrometer and 200 micrometers.

In the sensor device provided by an embodiment of the present application, a material of the functional dielectric layer includes at least one of polyvinylidene fluoride, polyphenylene sulfide, ethylene/vinyl alcohol copolymer, polyphthalamide, polyamide-imine, polyamide, polyetherimide, polymethyl methacrylate, or polyethylene terephthalate.

In the sensor device provided by an embodiment of the present application, the light control component includes a photosensitive thin film transistor and a switching thin film transistor, and the photosensitive thin film transistor and the switching thin film transistor are disposed in a same level;

the switching thin film transistor includes a first active layer, a first gate, a first source, and a first drain, wherein the first gate is disposed on the substrate, and the first source and the first drain are electrically connected to the first active layer; and the photosensitive thin film transistor includes a second gate, a second active layer, a second source and a second drain, wherein the second gate and the first gate are disposed in a same level, the second active layer and the first active layer are disposed in a same level, and the second source, the second drain, the first source and the first drain are disposed in a same level.

In the sensor device provided by an embodiment of the present application, the sensing device further includes:

a light-shielding layer disposed on the switching thin film transistor, and an orthographic projection of the light-shielding layer on the substrate is larger than an orthographic projection of the switching thin film transistor on the substrate.

In the sensor device provided by an embodiment of the present application, the sensor device further includes a gate insulating layer and a passivation layer stacked on the substrate in sequence; and the touch control component includes first touch control electrodes and second touch control electrodes, and the first touch control electrodes and the second touch control electrodes are disposed in a same level or in different levels.

In the sensor device provided by an embodiment of the present application, the first touch control electrodes and the second touch control electrodes are disposed and spaced apart from each other in a same level in the same level as that of the passivation layer, and any adjacent ones of the first touch control electrodes are electrically connected, and any adjacent ones of the second touch control electrodes are connected by a bridge.

In the sensor device provided by an embodiment of the present application, the first touch control electrodes are disposed in the same level as that of the gate insulating layer, and the second touch control electrodes are disposed in the same level as that of the passivation layer.

In the sensor device provided by an embodiment of the present application, the first touch control electrodes and the second touch control electrodes are disposed on the gate insulating layer, wherein any adjacent ones of the first touch control electrodes are connected by a bridge.

In the sensor device provided by an embodiment of the present application, the sensing device further includes:

a planarization layer disposed between the passivation layer and the functional dielectric layer.

Another embodiment of the present application further provides a display device, including a sensor device and a display panel, wherein the sensor device is integrated in the display panel or disposed on the display panel, and the sensor device includes:

a substrate;

a light control component disposed on the substrate;

a touch control component disposed on the substrate and located on one side of the light control component; and a functional dielectric layer disposed on a side of the touch control component away from the substrate and at least covers the touch control component, and configured to apply an electrostatic force to an external object when the external object is in contact with the functional dielectric layer, wherein the electrostatic force is positively correlated with a voltage value of the touch control component, a contact area of the external object with the functional dielectric layer, and a dielectric constant of the functional dielectric layer.

In the display device provided by an embodiment of the present application, the dielectric constant of the functional dielectric layer is greater than or equal to 2.5.

In the display device provided by an embodiment of the present application, a thickness of the functional dielectric layer ranges between 1 micrometer and 200 micrometers.

In the display device provided by an embodiment of the present application, a material of the functional dielectric layer includes at least one of polyvinylidene fluoride, polyphenylene sulfide, ethylene/vinyl alcohol copolymer, polyphthalamide, polyamide-imine, polyamide, polyetherimide, polymethyl methacrylate, or polyethylene terephthalate.

In the display device provided by an embodiment of the present application, the light control component includes a photosensitive thin film transistor and a switching thin film transistor, and the photosensitive thin film transistor and the switching thin film transistor are disposed in a same level;

the switching thin film transistor includes a first active layer, a first gate, a first source, and a first drain, wherein the first gate is disposed on the substrate, and the first source and the first drain are electrically connected to the first active layer; and the photosensitive thin film transistor includes a second gate, a second active layer, a second source and a second drain, wherein the second gate and the first gate are disposed in a same level, the second active layer and the first active layer are disposed in a same level, and the second source, the second drain, the first source and the first drain are disposed in a same level.

In the display device provided by an embodiment of the present application, the sensing device further includes:

a light-shielding layer disposed on the switching thin film transistor, and an orthographic projection of the light-shielding layer on the substrate is larger than an orthographic projection of the switching thin film transistor on the substrate.

In the display device provided by an embodiment of the present application, the sensor device further includes a gate insulating layer and a passivation layer stacked on the substrate in sequence; and the touch control component includes first touch control electrodes and second touch control electrodes, and the first touch control electrodes and the second touch control electrodes are disposed in a same level or in different levels.

In the display device provided by an embodiment of the present application, the first touch control electrodes and the second touch control electrodes are disposed and spaced apart from each other in a same level in the same level as that of the passivation layer, and any adjacent ones of the first touch control electrodes are electrically connected, and any adjacent ones of the second touch control electrodes are connected by a bridge.

In the display device provided by an embodiment of the present application, the first touch control electrodes are disposed in the same level as that of the gate insulating layer, and the second touch control electrodes are disposed in the same level as that of the passivation layer.

In the display device provided by an embodiment of the present application, the first touch control electrodes and the second touch control electrodes are disposed on the gate insulating layer, wherein any adjacent ones of the first touch control electrodes are connected by a bridge.

In the display device provided by an embodiment of the present application, the sensing device further includes:

a planarization layer disposed between the passivation layer and the functional dielectric layer.

In embodiments of the present application, a light control component is synchronously integrated as a light control sensor in a sensor device, and the touch control component is used as a tactile sensor, to realize the functions of short-range touch control and remote light control, thereby making up for the shortcomings of single-function touch control or light control.

In addition, embodiments of the present application use the functional dielectric layer as an insulating layer on the touch control component. When an external object touches the functional dielectric layer, the first touch control electrode and the second touch control electrode at a touched position are capacitively coupled with the external object, and then form two poles of a capacitor with the ground, respectively, to realize touch control sensing. Since the dielectric constant of the functional dielectric layer is large enough, when an external object touches the functional dielectric layer, a relatively large friction force is generated on a surface of the functional dielectric layer, thereby achieving a better tactile feedback effect.

DETAILED DESCRIPTION OF PREFERRED EMBODIMENTS

Figure 1:
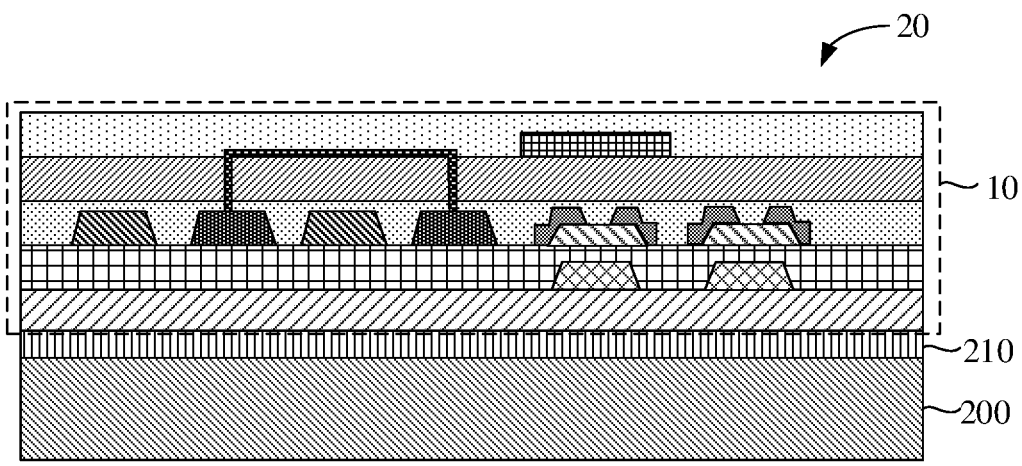
FIG. 1 is a schematic structural diagram of a display device provided by an embodiment of the present application.

In order to make the objectives, technical solutions, and advantages of the present invention clearer, the present invention will be described in further detail below with reference to the accompanying drawings. Referring to the drawings, wherein the same reference symbols represent the same elements. The following description is based on the specific embodiments of the present invention, which should not be construed as limiting other specific embodiments of the present invention that are not detailed herein. The term "embodiment" used in this specification means an example, instance, or illustration. In addition, the article "a" used in this specification and appended claims can generally be construed as "one or more" unless otherwise specified or can be clearly determined to be the singular form from the context.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of the present invention, it should be noted that the terms "installation", "connection", and "bonding" are to be understood broadly unless otherwise explicitly defined and limited. For example, it may be fixed connection, detachable connection, or integrally connection; being mechanical or electrical connection; also, being directly connection, indirectly connection through an intermediate medium, or internal communication of two components. The specific meaning of the above terms in the present invention can be understood in a specific case by those skilled in the art.

Referring to FIG. 1, an embodiment of the present application provides a display device. The display device 20 includes a sensor device 10 and a display panel 200. The sensor device 10 is integrated in the display panel 200 or disposed on the display panel 200. The display device 20 further includes an optical adhesive layer 210, and the optical adhesive layer 210 is used for bonding the display panel 200 and the sensor device 10. Among them, the display panel 200 includes a liquid crystal display, an organic light emitting diode display panel, a quantum dot light emitting diode display panel, a Mini LED display panel, or a Micro LED display panel. The liquid crystal display can be a color filter on the array substrate (Color Filter On Array, COA) or a non-COA structure liquid crystal display, and its display modes include twisted nematic (TN) and in-plane switching (In-Plane Switching, IPS) type, Vertical Alignment (VA) type and Fringe Field Switching (FFS) type.

Figure 2:
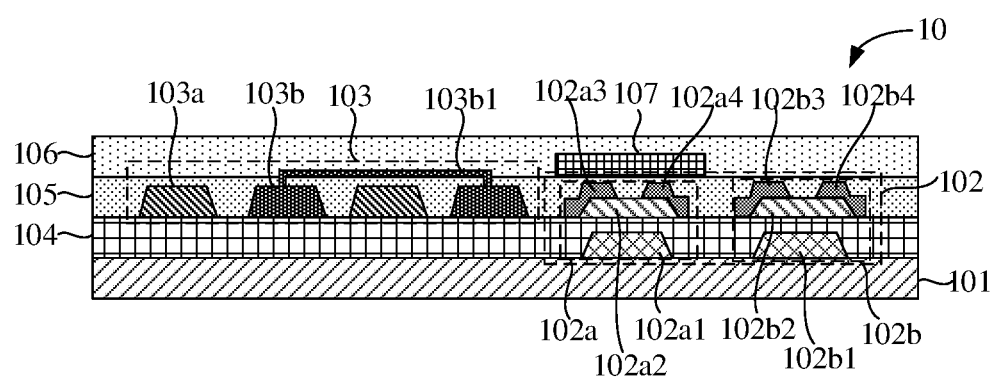
FIG. 2 to FIG. 6 are schematic structural diagrams of a sensor device provided by the embodiment of the present application.

Referring to FIG. 2, the sensor device 10 includes a substrate 101, a light control component 102, a touch control component 103, a gate insulating layer 104, a passivation layer 105, a functional dielectric layer 106 and a light-shielding layer 107. The touch control component 103 is located on one side of the light control component 102. The functional dielectric layer 106 is disposed on the side away from the substrate 101 and at least covers the touch control component 103. The functional dielectric layer 106 is used to apply electrostatic force to the external object when the external object contacts the functional dielectric layer 106. The voltage value of the component 103, the contact area of the external object and the functional dielectric layer 106, and the dielectric constant of the functional dielectric layer 106 are positively correlated. It should be noted that external objects refer to objects that can generate capacitance with the touch control component 103, including fingers, palms, and the like.

Specifically, the light control component 102 includes a switching thin film transistor 102a and a photosensitive thin film transistor 102b, and the switching thin film transistor 102a and the photosensitive thin film transistor 102b are disposed in the same level. The light control component 102 is used to sense the external light beam projected onto the sensor device 10. The switching thin film transistor 102a and the photosensitive thin film transistor 102b are disposed on a side of the substrate 101 close to the gate insulating layer 104. The switching thin film transistor 102a includes a first gate 102a1, a first active layer 102a2, a first source 102a3, and a first drain 102a4. The first gate 102a1 is disposed on a side of the substrate 101 close to the gate insulating layer 104. The first source 102a3 and the first drain 102a4 are electrically connected to the first active layer 102a2, respectively. In addition, the first active layer 102a2 is provided corresponding to the light-shielding layer 107. An orthographic projection of the light-shielding layer 107 on the substrate 101 covers an orthographic projection of the first active layer 102a2 on the substrate 101.

The photosensitive thin film transistor 102b includes a second gate 102b1, a second active layer 102b2, a second source 102b3, and a second drain 102b4. The second gate 102b1 and the first gate 102a1 are disposed in the same level, and the second gate 102b1 and the first gate 102a1 can be formed by the same mask process. The second active layer 102b2 and the first active layer 102a are provided in the same level. The second source 102b2, the second drain 102b3, the first source 102a3, and the first drain 102a4 are disposed in the same level.

In this embodiment, the first active layer 102a2 includes one of a hydrogenated amorphous silicon active layer, a low-temperature polysilicon active layer, and an oxide active layer, and the second active layer 102b2 includes a hydrogenated amorphous silicon active layer or low-temperature polysilicon active layer.

The sensor device 10 further includes a gate insulating layer and a passivation layer sequentially stacked on a substrate, and the gate insulating layer 104 covers the substrate 101, the first gate 102a1 and the second gate 102b1.

The passivation layer 105 covers the first active layer 102a2, the first source 102a3, the first drain 102a4, the second active layer 102b2, the second source 102b3, and the second drain 102b4. The passivation layer 105 is an inorganic passivation layer, which includes at least one of silicon nitride (SiNx), silicon oxide (SiOx), silicon oxynitride (SiNxOy), and aluminum oxide.

The touch control component 103 is disposed on the substrate 101. The touch control component 103 includes a first touch control electrode 103a and a second touch control electrode 103b, and the first touch control electrode 103a and the second touch control electrode 103b are disposed in the same level or in different levels.

Figure 7:
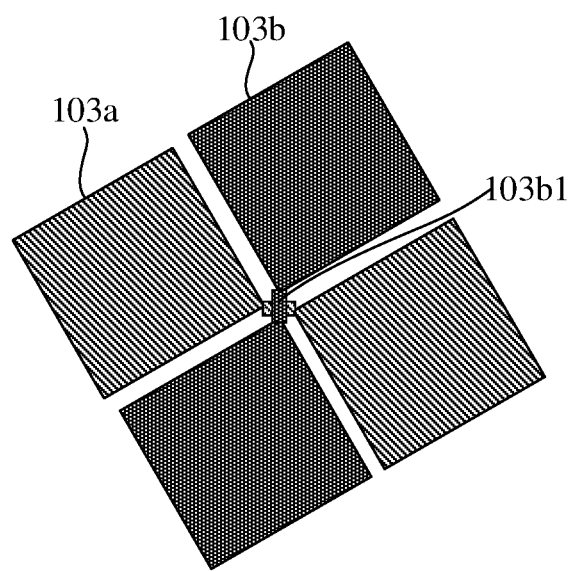
FIG. 7 is a top view of a touch control component provided by an embodiment of the present application.

Specifically, still referring to FIG. 2., the first touch control electrode 103a and the second touch control electrode 103b are in the same level and disposed in the same level as that of the passivation layer 105 at intervals. Referring to FIG. 2 and FIG. 7, FIG. 7 is a top view of a touch control component provided by an embodiment of the present application. Adjacent ones of the first touch control electrodes 103a are electrically connected, that is, the first touch control electrodes 103a are directly connected to each other. Adjacent ones of the second touch control electrodes 103b are connected by a bridge 103b1. Specifically, a part of the bridge 103b1 is disposed in the through hole, and another part of the bridge 103b1 is disposed on a side of the passivation layer 105 close to the functional dielectric layer 106. The material of the bridge 103b1 includes indium tin oxide.

Optionally, in an embodiment, the first touch control electrode 103a and the second touch control electrode 103b may also be embedded and insulated, for example, at least a part of the first touch control electrode 103a is embedded in the second touch control electrode 103b.

The sensor device 10 in an embodiment of the present application includes a touch control component 103 and a light control component 102. The short-range touch control principle of the sensor device 10 is to use an electrostatic force generated between the touch control component 103 and the human body to achieve the effect of tactile feedback. In an embodiment of the present application, the functional dielectric layer 106 is used as the insulating layer above the sensor device 10. When a finger touches the sensor device 10, friction is generated on a surface thereof, thereby generating different tactile feelings. In order to achieve a better tactile feedback effect, the friction between the human body and the touch control component 104 needs to be increased, and the friction is complied with a formula as follows:

$$F = u \frac{A\varepsilon\varepsilon_0}{2} \left(\frac{V}{d}\right)^2 \qquad \text{Formula (1)}$$

In the above formula, F is friction, A is the contact area between an external object (including a finger) and the sensor device 10, $\varepsilon$ is a relative permittivity of the functional dielectric layer 106, $\varepsilon_0$ is a vacuum permittivity, V is a voltage applied to the first touch control electrode 103a and the second touch control electrode 103b, and d is a thickness of the functional dielectric layer 106.

It can be seen from Formula (1) that increase in the friction force F between the touch control component 103 and the human body can be achieved by reducing the thickness of the functional dielectric layer 106 or using a material with a high relative permittivity as the insulating layer above the sensor device 10.

Therefore, in an embodiment of the present application, the polymer layer is used as the functional dielectric layer to realize a sensor device with better touch control feedback. The dielectric constant of the functional dielectric layer 106 is greater than or equal to 2.5, for example, the dielectric constant of the functional dielectric layer 106 is any one of 2.5, 3, 3.5, 4, 4.5, 5, or 6.

The material of the functional dielectric layer 106 includes at least one of polyvinylidene fluoride (PVDF), polyphenylene sulfide (PPS), ethylene/vinyl alcohol copolymer (EVOH), polyphthalamide (PPA), polyamide-imide (PAI), polyamide (PA), polyetherimide (PEI), polymethyl methacrylate (PMMA), or polyethylene terephthalate (PET). The thickness of the functional dielectric layer 106 is between 1 μm and 200 μm. For example, the thickness of the functional dielectric layer 106 may be at least one of 1 micrometer, 1 micrometer, 10 micrometers, 30 micrometers, 55 micrometers, 80 micrometers, 100 micrometers, 125 micrometers, 145 micrometers, 1160 micrometers, or 185 micrometers.

It should be noted that the functional dielectric layer 106 in an embodiment of the present application may be disposed at a position corresponding to the touch control component 103 to improve the accuracy of the sensor device 10. Alternatively, the functional dielectric layer 106 covers the touch control component 103 and the light control component 102. The functional dielectric layer 106 corresponding to the light control component 102 is used to prevent the switching thin film transistor 102a and the photosensitive thin film transistor 102b from being corroded by water and oxygen.

Still referring to FIG. 2, the light-shielding layer 107 is disposed on the switching thin film transistor 102a. In addition, an orthographic projection of the light-shielding layer 107 on the substrate 101 is larger than an orthographic projection of the switching thin film transistor 102a on the substrate 101. Specifically, the first active layer 102a2 and the light-shielding layer 107 are disposed correspondingly. The orthographic projection of the light-shielding layer 107 on the substrate 101 covers the orthographic projection of the first active layer 102a2 on the substrate 101. The material of the light-shielding layer 107 includes metal, metal oxide, polymer material, and the like. The light-shielding layer 107 is used to shield the switching thin film transistor 102a from external light, and prevent the first active layer 102a2 from being damaged by external light.

The sensor device 10 provided in this embodiment uses the functional dielectric layer 106 as the insulating layer on the touch control component 103. When an external object touches the functional dielectric layer 106, the first touch control electrode 103a and the second touch control electrode 103b at a touched position are capacitively coupled with the external object, and then form two poles of a capacitor with the ground, respectively, to realize touch control sensing. Since the dielectric constant of the functional dielectric layer 106 is large enough, when an external object touches the functional dielectric layer 106, a relatively large friction force is generated on a surface of the functional dielectric layer, thereby achieving a better tactile feedback effect. In addition, the sensor device 10 is also integrated with a light control component 102 to realize the functions of short-range touch control and remote light control, which makes up for the shortcomings of single-function touch control or light control.

Figure 3:
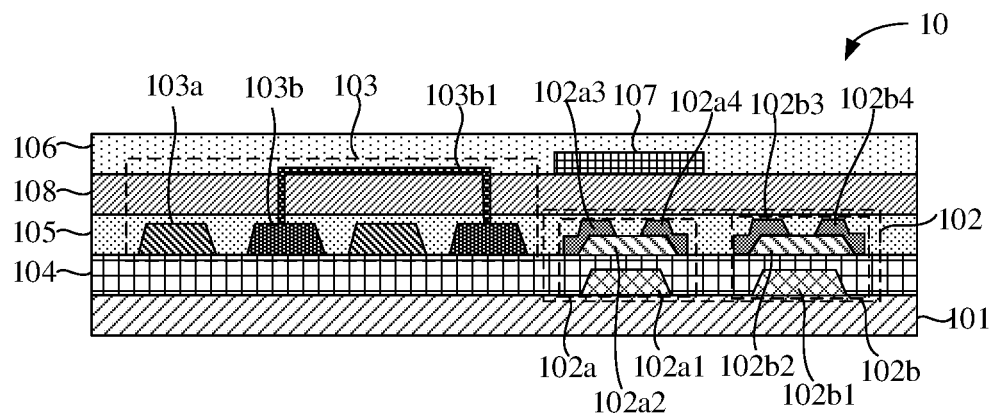

Optionally, referring to FIG. 3, in an embodiment, the sensor device 10 further includes a planarization layer 108, and the planarization layer 108 is disposed between the passivation layer 105 and the functional dielectric layer 106. The material of the planarization layer 108 includes an organic material, and the planarization layer 108 can act simultaneously with the functional dielectric layer 106 to provide electrostatic force for the sensor device 10.

Figure 4:
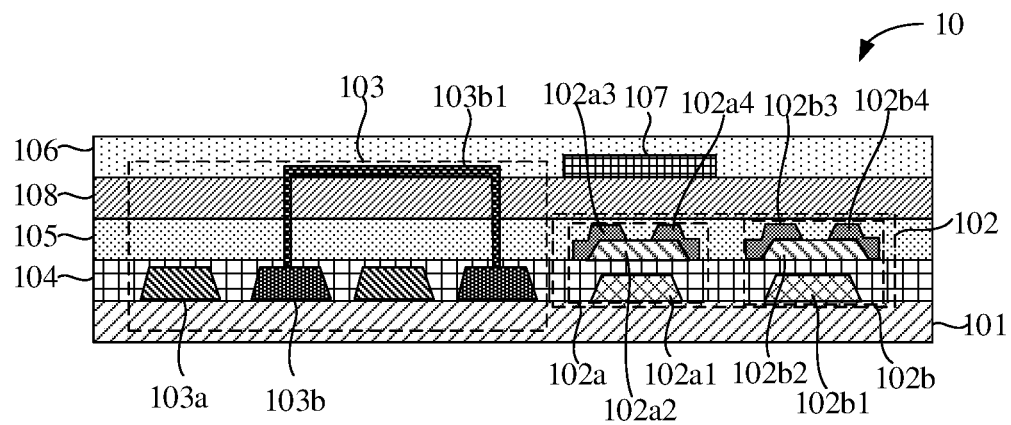

Optionally, referring to FIG. 4, in one embodiment, the first touch control electrode 103a and the second touch control electrode 103b are provided in the same level and spaced apart from each other in the same level as that of the gate insulating layer 104, and the first touch control electrode 103a and the second touch control electrode 103b can be formed by the same mask process with the first gate 102a1 and the second gate 102b1. Adjacent ones of the first touch control electrodes 103a are electrically connected, adjacent ones of the second touch control electrodes 103b are connected by a bridge 103b1, the bridge 103b1 penetrates the planarization layer 108, and at least a part of the bridge 103b1 is provided on the side of the planarization layer 108 away from the passivation layer 105.

Figure 5:
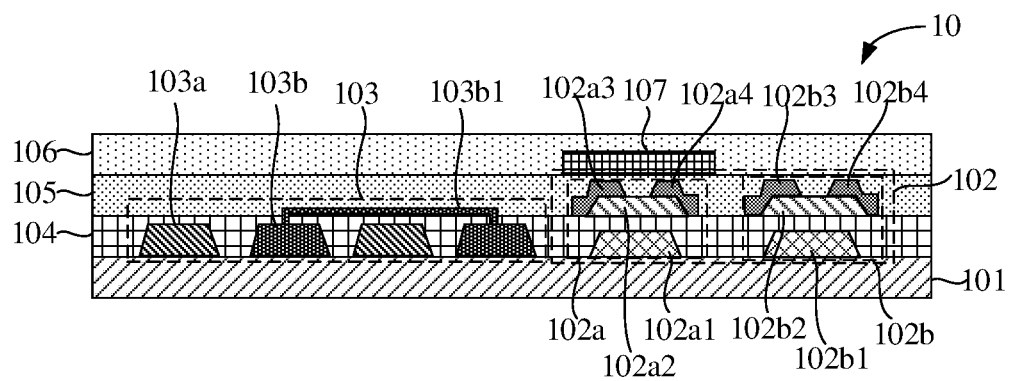

Optionally, referring to FIG. 5, in another embodiment, the sensor device 10 may not include the planarization layer 108, that is, a part of the bridge 103b1 is disposed in the through hole, and another part of the bridge 103b1 is disposed on a side of the insulating layer 104 close to the passivation layer 105.

Figure 6:
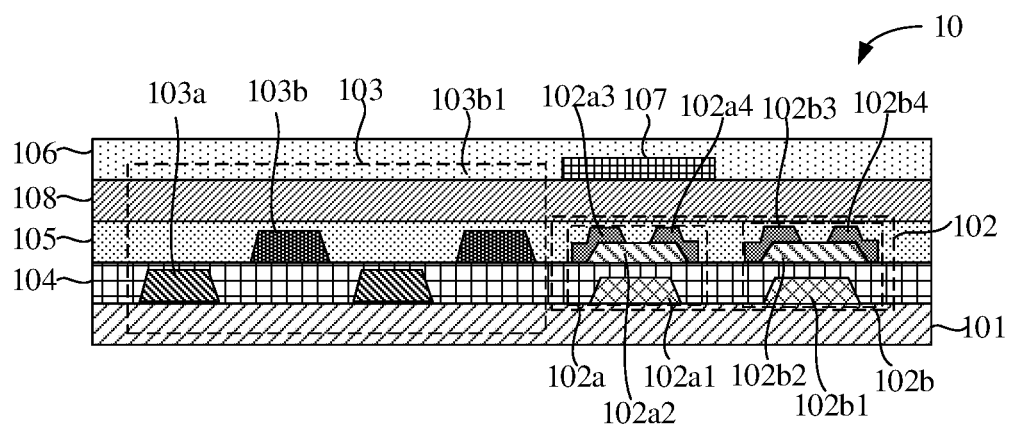

Optionally, referring to FIG. 6, the first touch control electrode 103a is disposed in the same level as that of the gate insulating layer 104, where the first touch control electrode 103a and the first gate electrode 102a1 can be formed by the same mask process. The second touch control electrode 103b is disposed in the same level as that of the passivation layer 105.

The sensor device in an embodiment of the present application integrates the functions of light control sensing and touch control sensing, wherein the touch control sensing adopts a capacitive touch control mode, and the capacitive touch control is realized by a capacitance change generated by the electrostatic coupling between the electrode and the human finger. Specifically, the capacitive touch control mode includes self capacitance and mutual capacitance.

Taking the self-capacitance mode as the touch control mode of the sensor device 10 as an example, the touch control principle of the self-capacitance mode is that: the first touch control electrode 103a and the second touch control electrode 103b are capacitively coupled with a finger and then form two poles of the capacitance with the ground, respectively. When a finger touches the surface of the sensor device 10, the capacitance of the finger will be superimposed on the sensor device at the touched position, so that the capacitance increases.

Compared with the self-capacitance sensor device, the mutual capacitance type has higher sensitivity and accuracy. The working principle of the mutual-capacitance sensor device is that: the intersection of the first touch control electrode 103a and the second touch control electrode 103b forms a capacitance, that is, the first touch control electrode 103a and the second touch control electrode 103b respectively form two poles of the capacitance. When the finger touches the sensor device 10, the coupling between the two electrodes near the touched point is affected, thereby changing the capacitance between the first touch control electrode 103a and the second touch control electrode 103b.

Figure 8:
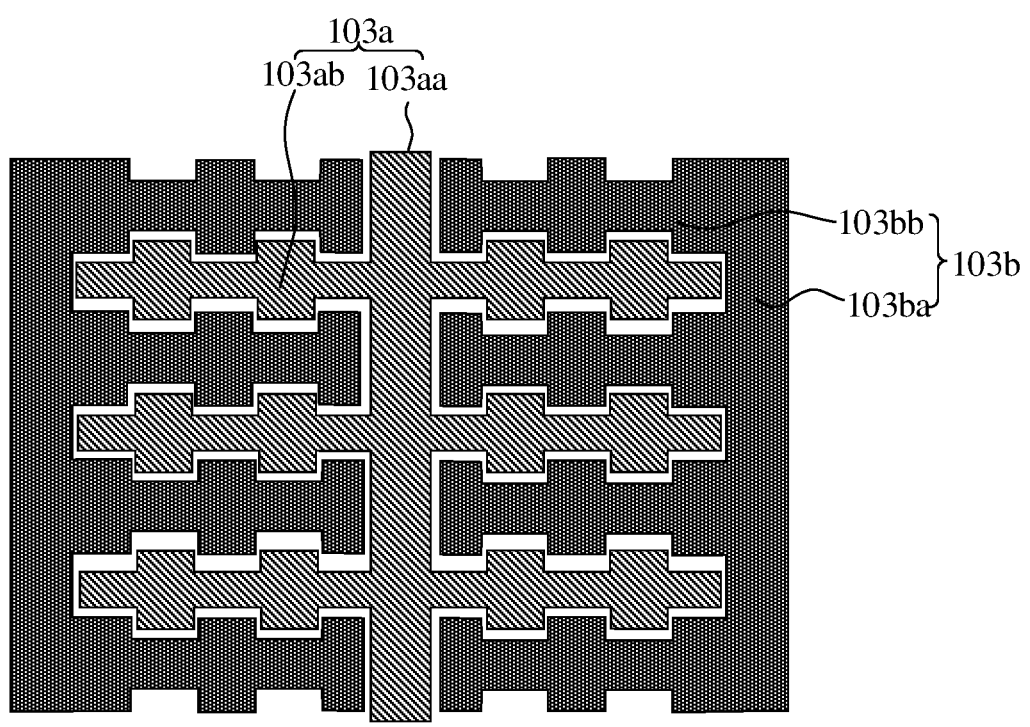
FIG. 8 is a top view of a touch control component in a sensor device provided by another embodiment of the present application.

In order to increase the sensitivity and accuracy of the touch control component 103, in an embodiment of the present application, the first touch control electrode 103a is embedded in the second touch control electrode 103b to enlarge the embedded area between the first touch control electrode 103a and the second touch control electrode 103b, thereby improving the sensitivity and accuracy of the sensor device 10. Specifically, referring to FIG. 8. The embodiment of the present application defines a first touch control electrode 103 a and a second touch control electrode 103 b that are fitted together as a touch control unit. In a touch control unit, the first touch control electrode 103a includes a first body portion 103aa and a plurality of first coupling portions 103ab. The first body portion 103aa is electrically connected to the first coupling portions 103ab, and the first body portion 103aa is disposed vertical to the first coupling portions 103ab. Specifically, the plurality of first coupling portions 103ab are disposed on opposite sides of the first main body portion 103aa at intervals. The second touch control electrode 103b includes a second body portion 103ba and a plurality of second coupling portions 103bb. The second body portion 103ba is electrically connected to the second coupling portions 103bb, and the second body portion 103ba is arranged vertical to the second coupling portions 103bb. The first coupling portion 103ab and the second coupling portion 103bb are insulated from each other and fitted together. It should be understood that the touch control component 103 in an embodiment of the present application includes a plurality of touch control units, and the plurality of touch control units are arranged in an array.

Embodiments of the present application are mainly aimed at realizing the functions of light control and touch control synchronously, wherein the On-glass mode is adopted. First, a-Si is used as the photosensitive semiconductor material, the photosensitive thin film transistor used as a structure of the light control sensor and the tactile integrated component used as a touch control sensor are synchronously integrated into the display panel, which can realize the functions of short-range touch control and remote light control, and make up for the shortcomings of single-function touch control or light control. Compared with capacitive touch, the sensor device in an embodiment of the present application uses a touch control sensor with tactile feedback, which is used in some specific application scenarios, such as games, vehicle displays, etc., and in order to improve the tactile feedback effect of touch control, improve user experience, enhance the effects of games, videos, and music, and intuitively and accurately reconstruct the "mechanical" tactile sensation, realistic tactile feedback is provided, to make up for the inefficiency of audio and visual feedback in specific scenarios.

Figure 9:
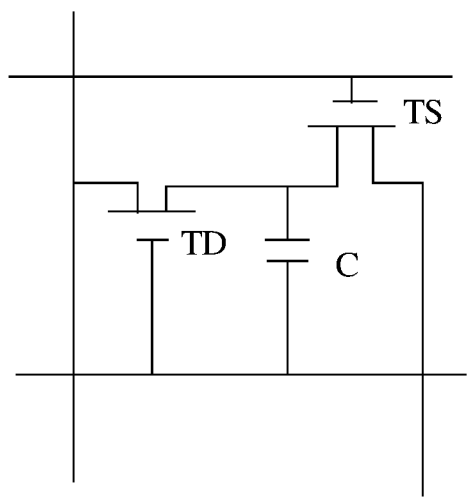
FIG. 9 is a circuit diagram of a light control component provided by an embodiment of the present application.

As shown in FIG. 9, the embodiment of the present application adopts 2T1C, where TS is a photosensitive TFT, TD is a switching TFT, and C is a capacitor.

Embodiments of the present application adopt light control sensing and touch control sensing to complete synchronously, and can be synchronously integrated in the current display panel, which can realize the functions of short-range touch control and remote light control, and make up for the shortcomings of single-function touch control or light control.

The sensor device 10 in an embodiment of the present application includes a touch control component 103 and a light control component 102. The short-range touch control principle of the sensor device 10 is to use an electrostatic force generated between the touch control component 103 and the human body to achieve the effect of tactile feedback. In an embodiment of the present application, the functional dielectric layer 106 is used as the insulating layer above the sensor device 10. When a finger touches the sensor device 10, friction is generated on a surface thereof, thereby generating different tactile feelings. In order to achieve a better tactile feedback effect, the friction between the human body and the touch control component 104 needs to be increased, and the friction is complied with a formula as follows:

$$F = u\frac{A\varepsilon\varepsilon_0}{2}\left(\frac{V}{d}\right)^2 \qquad \text{Formula (1)}$$

In the above formula, F is friction, A is the contact area between an external object (including a finger) and the sensor device 10, $\varepsilon$ is a relative permittivity of the functional dielectric layer 106, $\varepsilon 0$ is a vacuum permittivity, V is a voltage applied to the first touch control electrode 103a and the second touch control electrode 103b, and d is a thickness of the functional dielectric layer 106.

It can be seen from Formula (1) that increase in the friction force F between the touch control component 103 and the human body can be achieved by reducing the thickness of the functional dielectric layer 106 or using a material with a high relative permittivity as the insulating layer above the sensor device 10. An embodiment of the present application uses the polymer layer as the functional dielectric layer to realize a sensor device with better touch control feedback.

The principle of remote light control in an embodiment of the present application is that: when the sensor device 10 is stimulated by light, the second active layer 102b2 in the photosensitive thin film transistor 102b will generate carriers, and the carriers are collected by the storage capacitor and then display the light control function through the control of the switching thin film transistor 102a, being processed by an amplifier, and detected by a chip (IC).

In embodiments of the present application, a light control component is synchronously integrated as a light control sensor in a sensor device, and the touch control component is used as a tactile sensor, to realize the functions of short-range touch control and remote light control, thereby making up for the shortcomings of single-function touch control or light control.

In addition, embodiments of the present application use the functional dielectric layer as an insulating layer on the touch control component. When an external object touches the functional dielectric layer, the first touch control electrode and the second touch control electrode at a touched position are capacitively coupled with the external object, and then form two poles of a capacitor with the ground, respectively, to realize touch control sensing. Since the dielectric constant of the functional dielectric layer is large enough, when an external object touches the functional dielectric layer, a relatively large friction force is generated on a surface of the functional dielectric layer, thereby achieving a better tactile feedback effect.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A sensor device, comprising:
   a substrate;
   a gate insulating layer on the substrate;
   a passivation layer on the gate insulating layer;
   a light control component disposed on the substrate;
   a touch control component disposed on the substrate and located on one side of the light control component, wherein the touch control component comprises first touch control electrodes and second touch control electrodes, any adjacent ones of the first touch control electrodes are electrically connected, and any adjacent ones of the second touch control electrodes are connected by a bridge; and
   a functional dielectric layer disposed on a side of the touch control component away from the substrate and at least covers the touch control component, and configured to apply an electrostatic force to an external object when the external object is in contact with the functional dielectric layer, wherein the electrostatic force is positively correlated with a voltage value of the touch control component, a contact area of the external object with the functional dielectric layer, and a dielectric constant of the functional dielectric layer,
   wherein each layer between the functional dielectric layer and the touch control component is an insulating layer,
   wherein the first touch control electrodes and the second touch control electrodes are spaced apart from each other in a same level as that of one of the gate insulating layer and the passivation layer; and
   wherein the sensor device further comprises: a planarization layer disposed between the passivation layer and the functional dielectric layer to provide electrostatic force for the sensor device along with the functional dielectric layer.

2. The sensing device according to claim 1, wherein the dielectric constant of the functional dielectric layer is greater than or equal to 2.5.

3. The sensor device according to claim 1, wherein a thickness of the functional dielectric layer ranges between 1 micrometer and 200 micrometers.

4. The sensor device according to claim 1, wherein a material of the functional dielectric layer comprises at least one of polyvinylidene fluoride, polyphenylene sulfide, ethylene/vinyl alcohol copolymer, polyphthalamide, polyamide-imine, polyamide, polyetherimide, polymethyl methacrylate, or polyethylene terephthalate.

5. The sensing device according to claim 1, wherein the light control component comprises a photosensitive thin film transistor and a switching thin film transistor, and the photosensitive thin film transistor and the switching thin film transistor are disposed in a same level;
   the switching thin film transistor comprises a first active layer, a first gate, a first source, and a first drain, wherein the first gate is disposed on the substrate, and the first source and the first drain are electrically connected to the first active layer; and
   the photosensitive thin film transistor comprises a second gate, a second active layer, a second source and a second drain, wherein the second gate and the first gate are disposed in a same level, the second active layer and the first active layer are disposed in a same level, and the second source, the second drain, the first source and the first drain are disposed in a same level.

6. The sensing device according to claim 5, wherein the sensing device further comprises:
   a light-shielding layer disposed on the switching thin film transistor, and an orthographic projection of the light-shielding layer on the substrate is larger than an orthographic projection of the switching thin film transistor on the substrate.

7. A display device, comprising a sensor device and a display panel, wherein the sensor device is integrated in the display panel or disposed on the display panel, and the sensor device comprises:
   a substrate;
   a light control component disposed on the substrate;
   a touch control component disposed on the substrate and located on one side of the light control component, wherein the touch control component comprises first touch control electrodes and second touch control electrodes, any adjacent ones of the first touch control electrodes are electrically connected, and any adjacent ones of the second touch control electrodes are connected by a bridge; and
   a functional dielectric layer disposed on a side of the touch control component away from the substrate and at least covers the touch control component, and configured to apply an electrostatic force to an external object when the external object is in contact with the functional dielectric layer, wherein the electrostatic force is positively correlated with a voltage value of the touch control component, a contact area of the external object with the functional dielectric layer, and a dielectric constant of the functional dielectric layer,
   wherein each layer between the functional dielectric layer and the touch control component is an insulating layer,
   wherein the first touch control electrodes and the second touch control electrodes are spaced apart from each other in a same level as that of one of the gate insulating layer and the passivation layer; and wherein the sensor device further comprises: a planarization layer disposed between the passivation layer and the functional dielectric layer to provide electrostatic force for the sensor device along with the functional dielectric layer.

8. The display device according to claim 7, wherein the dielectric constant of the functional dielectric layer is greater than or equal to 2.5.

9. The display device according to claim 7, wherein a thickness of the functional dielectric layer ranges between 1 micrometer and 200 micrometers.

10. The display device according to claim 7, wherein a material of the functional dielectric layer comprises at least one of polyvinylidene fluoride, polyphenylene sulfide, ethylene/vinyl alcohol copolymer, polyphthalamide, polyamide-imine, polyamide, polyetherimide, polymethyl methacrylate, or polyethylene terephthalate.

11. The display device according to claim 7, wherein the light control component comprises a photosensitive thin film transistor and a switching thin film transistor, and the photosensitive thin film transistor and the switching thin film transistor are disposed in a same level;

the switching thin film transistor comprises a first active layer, a first gate, a first source, and a first drain, wherein the first gate is disposed on the substrate, and the first source and the first drain are electrically connected to the first active layer; and the photosensitive thin film transistor comprises a second gate, a second active layer, a second source and a second drain, wherein the second gate and the first gate are disposed in a same level, the second active layer and the first active layer are disposed in a same level, and the second source, the second drain, the first source and the first drain are disposed in a same level.

12. The display device according to claim 11, wherein the sensing device further comprises:

a light-shielding layer disposed on the switching thin film transistor, and an orthographic projection of the light-shielding layer on the substrate is larger than an orthographic projection of the switching thin film transistor on the substrate.

* * * * *